United States Patent
Jung et al.

(10) Patent No.: US 12,047,134 B2
(45) Date of Patent: Jul. 23, 2024

(54) BROADCAST SIGNAL TRANSMISSION/RECEPTION METHOD USING MULTIPLE ANTENNAS AND LAYERED-DIVISION MULTIPLEXING AND APPARATUS FOR THE SAME

(71) Applicant: ELECTRONICS AND TELECOMMUNICATIONS RESEARCH INSTITUTE, Daejeon (KR)

(72) Inventors: Hoi-Yoon Jung, Daejeon (KR); Bo-Mi Lim, Daejeon (KR); Sung-Ik Park, Daejeon (KR); Hae-Chan Kwon, Daejeon (KR); Sung-Jun Ahn, Daejeon (KR); Nam-Ho Hur, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 18/049,530

(22) Filed: Oct. 25, 2022

(65) Prior Publication Data
US 2023/0146118 A1    May 11, 2023

(30) Foreign Application Priority Data
Nov. 8, 2021  (KR) .................. 10-2021-0152283

(51) Int. Cl.
*H04B 7/0456* (2017.01)
*H03M 13/25* (2006.01)
*H04L 1/00* (2006.01)

(52) U.S. Cl.
CPC ........ *H04B 7/0456* (2013.01); *H03M 13/255* (2013.01); *H04L 1/0071* (2013.01)

(58) Field of Classification Search
CPC .......... H04B 7/0456; H04B 1/10; H04B 7/10; H04L 1/0071; H04L 1/0041;
(Continued)

(56) References Cited

U.S. PATENT DOCUMENTS

| 10,225,040 B2 | 3/2019 | Park |
| 2010/0232348 A1* | 9/2010 | Wu ........................ H04L 1/0003 370/329 |

(Continued)

FOREIGN PATENT DOCUMENTS

| KR | 10-2011-0047101 A | 5/2011 |
| KR | 10-1223605 B1 | 1/2013 |
| KR | 10-2017-0009737 A | 1/2017 |

OTHER PUBLICATIONS

"ATSC Standard: Physical Layer Protocol," Advanced Television Systems Committee, Jan. 20, 2021, A/322.

*Primary Examiner* — Khanh C Tran

(57) ABSTRACT

Disclosed herein are a broadcast signal transmission/reception method using multiple antennas and layered-division multiplexing and an apparatus for the same. A broadcast signal transmission apparatus includes a Multiple-Input Multiple-Output (MIMO) Bit-Interleaved Coded Modulation (BICM) unit for dividing enhanced layer data into two enhanced layer signals having different polarizations, a combination unit for generating a multiplexed signal corresponding to a first transmitting antenna by combining a core layer signal corresponding to core layer data with a first enhanced layer signal, and transmission signal generation units for generating a first transmission signal, corresponding to the multiplexed signal and transmitted through the first transmitting antenna, and a second transmission signal, corresponding to a second enhanced layer signal and transmitted through a second transmitting antenna.

18 Claims, 14 Drawing Sheets

(58) Field of Classification Search
CPC . H04L 5/0048; H04L 5/0053; H04L 27/2627;
H04L 25/0204; H03M 13/255
See application file for complete search history.

(56) References Cited

U.S. PATENT DOCUMENTS

2011/0103513 A1   5/2011  Kim
2018/0351609 A1*  12/2018 Park .................. H04L 25/03343

* cited by examiner

BROADCAST SIGNAL TRANSMISSION/RECEPTION METHOD USING MULTIPLE ANTENNAS AND LAYERED-DIVISION MULTIPLEXING AND APPARATUS FOR THE SAME

CROSS REFERENCE TO RELATED APPLICATION

This application claims the benefit of Korean Patent Application No. 10-2021-0152283, filed on Nov. 8, 2021, which is hereby incorporated by reference in its entirety into this application.

BACKGROUND OF THE INVENTION

1. Technical Field

The present invention relates to digital broadcasting technology, and more particularly to technology for transmitting and receiving a broadcast signal using multiple antennas and layered-division multiplexing technology in a next-generation terrestrial broadcasting system.

2. Description of the Related Art

The next generation terrestrial broadcasting system may provide an enhanced transmission performance based on the ATSC 3.0 standard. The next-generation terrestrial broadcasting system introduces a multi-antenna transmission scheme so as to provide an improved data transfer rate compared to a single-antenna system. The multi-antenna transmission scheme is a scheme in which two antennas are used at each of a transmitting end and a receiving end. At the transmitting end, cross-polarization antennas are used as two transmitting antennas in such a way that one transmission stream is transmitted using horizontal polarization and the other transmission stream is transmitted using vertical polarization.

The next-generation terrestrial broadcasting system introduces a multiplexing scheme for simultaneously providing a broadcasting service with a 4K-Ultra-High Definition (UHD) resolution and a broadcasting service with a High Definition (HD) resolution. As one of the multiplexing schemes, a layered-division multiplexing scheme for transmitting a broadcast signal with different transmission powers in the same time resource and frequency resource is introduced.

To date, the next-generation terrestrial broadcasting system supports each of multi-antenna transmission technology and layered-division multiplexing transmission technology, but does not support technology in which the two technologies are combined with each other.

PRIOR ART DOCUMENTS

Patent Documents (Patent Document 1) Korean Patent No. 10-1223605, Date of Publication: Jan. 21, 2013 (Title: System and Method, Transmitter and Transmitting Method, Receiver and Receiving Method for MIMO Communication)

SUMMARY OF THE INVENTION

Accordingly, the present invention has been made keeping in mind the above problems occurring in the prior art, and an object of the present invention is to improve the performance of a broadcasting system using multiple antennas.

Another object of the present invention is to provide technology for transmitting and receiving a broadcast signal in a multi-antenna system to which layered-division multiplexing is applied.

In accordance with an aspect of the present invention to accomplish the above objects, there is provided a broadcast signal transmission apparatus, including a Multiple-Input Multiple-Output (MIMO) Bit-Interleaved Coded Modulation (BICM) unit for dividing enhanced layer data into two enhanced layer signals having different polarizations; a combination unit for generating a multiplexed signal corresponding to a first transmitting antenna by combining a core layer signal corresponding to core layer data with a first enhanced layer signal; and transmission signal generation units for generating a first transmission signal, corresponding to the multiplexed signal and transmitted through the first transmitting antenna, and a second transmission signal, corresponding to a second enhanced layer signal and transmitted through a second transmitting antenna.

When the first enhanced layer signal is a horizontal polarization signal, the first transmitting antenna may correspond to a horizontal polarization antenna, whereas when the first enhanced layer signal is a vertical polarization signal, the first transmitting antenna may correspond to a vertical polarization antenna.

Transmission power of data included in the second transmission signal may be lower than transmission power of data included in the first transmission signal by a preset transmission power offset.

The first transmission signal may include a first bootstrap, a first preamble, and first data, and transmission powers of the first bootstrap, the first preamble, and the first data are identical to each other.

When a second bootstrap and a second preamble are included in the second transmission signal, transmission powers of the second bootstrap and the second preamble may be lower than transmission power of the first transmission signal by the preset transmission power offset.

When a second bootstrap and a second preamble are not included in the second transmission signal, the second transmission signal may be transmitted to include a sequence having transmission power identical to that of second data included in the second transmission signal.

The sequence may be transmitted at a time point at which the first bootstrap and the first preamble are transmitted, and may correspond to a binary sequence.

The broadcast signal transmission apparatus may further include a Bit-Interleaved Coded Modulation (BICM) unit for performing channel coding, bit interleaving, and constellation mapping on the core layer data.

The enhanced layer signals may be generated by performing channel coding, bit interleaving, Multiple-Input Multiple-Output (MIMO) demultiplexing, and constellation mapping on the enhanced layer data.

The broadcast signal transmission apparatus may further include injection level controllers for controlling transmission powers of the enhanced layer signals.

In accordance with another aspect of the present invention to accomplish the above objects, there is provided a broadcast signal reception apparatus, including signal receivers for generating received signals based on signals received through multiple receiving antennas; a first decoder for reconstructing a core layer signal corresponding to a signal received through a first receiving antenna; and a second decoder for reconstructing an enhanced layer signal based on a first enhanced layer signal, in which the core layer signal is removed from the signal received through the first receiving antenna, and a second enhanced layer signal received through the second receiving antenna.

The first receiving antenna and the second receiving antenna may receive signals having different polarizations, wherein the first receiving antenna corresponds to a horizontal polarization antenna or a vertical polarization antenna.

The core layer signal may be reconstructed by performing channel decoding, bit deinterleaving, and constellation demapping on the signal received through the first receiving antenna.

A cancellation signal may be generated by performing channel coding, bit interleaving, and constellation mapping on the reconstructed core layer signal, and the first enhanced layer signal may be extracted by removing the cancellation signal from the signal received through the first receiving antenna.

The enhanced layer signal may be reconstructed by performing channel decoding, bit deinterleaving, MIMO multiplexing, and constellation demapping on the first enhanced layer signal and the second enhanced layer signal.

The received signals may be generated by performing an OFDM signal demodulation process on the signals received through the multiple receiving antennas.

In accordance with a further aspect of the present invention to accomplish the above objects, there is provided a broadcast signal transmission apparatus, including a Multiple-Input Multiple-Output (MIMO) Bit-Interleaved Coded Modulation (BICM) unit for dividing enhanced layer data into two enhanced layer signals having different polarizations; a first combination unit for generating a first multiplexed signal corresponding to a first transmitting antenna by combining a core layer signal corresponding to core layer data with a first enhanced layer signal; a second combination unit for generating a second multiplexed signal corresponding to a second transmitting antenna by combining the core layer signal with the second enhanced layer signal; and transmission signal generation units for generating a first transmission signal, corresponding to the first multiplexed signal and transmitted through the first transmitting antenna, and a second transmission signal, corresponding to the second multiplexed signal and transmitted through the second transmitting antenna.

When the first enhanced layer signal is a horizontal polarization signal, the first transmitting antenna may correspond to a horizontal polarization antenna, whereas when the first enhanced layer signal is a vertical polarization signal, the first transmitting antenna may correspond to a vertical polarization antenna.

Transmission power of data included in the first transmission signal may be identical to transmission power of data included in the second transmission signal.

The first transmission signal may include a first bootstrap, a first preamble, and first data, and transmission powers of the first bootstrap, the first preamble, and the first data may be identical to each other.

The second transmission signal may include a second bootstrap, a second preamble and second data, and transmission powers of the second bootstrap, the second preamble, and the second data may be identical to each other.

In accordance with yet another aspect of the present invention to accomplish the above objects, there is provided a broadcast signal reception apparatus, including a broadcast signal reception apparatus, including signal receivers for generating received signals based on signals received through multiple receiving antennas; channel estimation units for estimating channels between the receiving antennas and transmitting antennas; a first decoder for reconstructing a core layer signal corresponding to the received signals; and a second decoder for reconstructing an enhanced layer signal based on the reconstructed core layer signal for a signal received through each of the receiving antennas.

In accordance with still another aspect of the present invention to accomplish the above objects, there is provided a broadcast signal transmission method, including dividing enhanced layer data into two enhanced layer signals having different polarizations; generating a multiplexed signal corresponding to a first transmitting antenna by combining a core layer signal corresponding to core layer data with a first enhanced layer signal; and generating a first transmission signal, corresponding to the multiplexed signal and transmitted through the first transmitting antenna, and a second transmission signal, corresponding to a second enhanced layer signal and transmitted through a second transmitting antenna.

In accordance with still further aspect of the present invention to accomplish the above objects, there is provided a broadcast signal reception method, including generating received signals based on signals received through multiple receiving antennas; reconstructing a core layer signal corresponding to a signal received through a first receiving antenna; and reconstructing an enhanced layer signal based on a first enhanced layer signal in which the core layer signal is removed from the signal received through the first receiving antenna and a second enhanced layer signal received through the second receiving antenna.

In accordance with still another aspect of the present invention to accomplish the above objects, there is provided a broadcast signal transmission method, including dividing enhanced layer data into two enhanced layer signals having different polarizations; generating a first multiplexed signal corresponding to a first transmitting antenna by combining a core layer signal corresponding to core layer data with a first enhanced layer signal; generating a second multiplexed signal corresponding to a second transmitting antenna by combining the core layer signal with a second enhanced layer signal; and generating a first transmission signal, corresponding to the first multiplexed signal and transmitted through the first transmitting antenna, and a second transmission signal, corresponding to the second multiplexed signal and transmitted through the second transmitting antenna.

In accordance with still another aspect of the present invention to accomplish the above objects, there is provided a broadcast signal reception method, including generating received signals based on signals received through multiple receiving antennas; estimating channels between the receiving antennas and transmitting antennas; reconstructing a core layer signal corresponding to the received signals; and reconstructing an enhanced layer signal based on the reconstructed core layer signal for a signal received through each of the receiving antennas.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
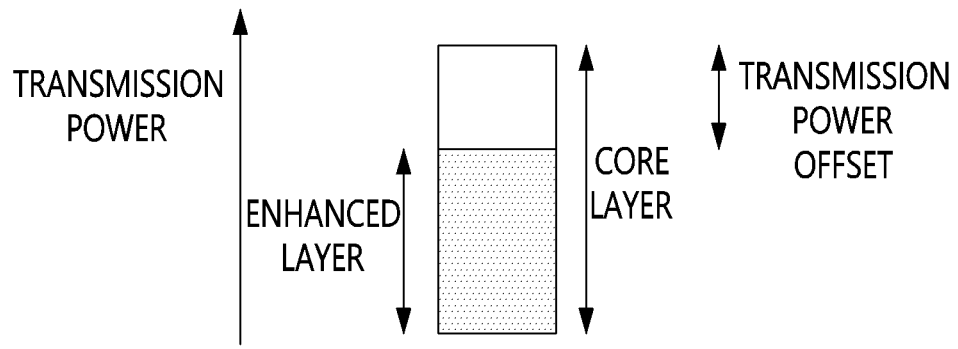
FIG. 1 is a diagram illustrating the concept of a layered-division multiplexing scheme according to an embodiment of the present invention.

The present invention will be described in detail below with reference to the accompanying drawings. Repeated descriptions and descriptions of known functions and configurations which have been deemed to make the gist of the present invention unnecessarily obscure will be omitted below. The embodiments of the present invention are intended to fully describe the present invention to a person having ordinary knowledge in the art to which the present invention pertains. Accordingly, the shapes, sizes, etc. of components in the drawings may be exaggerated to make the description clearer.

Hereinafter, preferred embodiments of the present invention will be described in detail with reference to the attached drawings.

A next-generation terrestrial broadcasting system based on the ATSC 3.0 standard includes a layered-division multiplexing scheme. The layered-division multiplexing scheme may transmit different services using different transmission powers in the same time and frequency resources. Using these characteristics, the layered-division multiplexing scheme may efficiently provide different services.

FIG. 1 is a diagram illustrating the concept of a layered-division multiplexing scheme according to an embodiment of the present invention.

Referring to FIG. 1, a layer which is transmitted with relatively high transmission power in the layered-division multiplexing scheme is referred to as a "core layer", and a layer which is transmitted with relatively low transmission power is referred to as an "enhanced layer".

Here, the enhanced layer is transmitted by attenuating signal strength by a transmission power offset (i.e., injection level) from a core layer signal. For example, assuming that transmission power of the core layer signal is X dB and a transmission power offset (injection level) is Y dB, an enhanced layer signal may be transmitted with a transmission power of (X-Y) dB.

The core layer in layered-division multiplexing aims at providing a service for a small-sized mobile terminal such as a portable terminal. Therefore, the core layer generally uses a transmission scheme relatively robust to a channel environment or the like.

On the other hand, the enhanced layer aims at providing a service for a fixed reception terminal installed in a house. Therefore, the enhanced layer generally uses a transmission scheme having a high data transfer rate.

Figure 2:
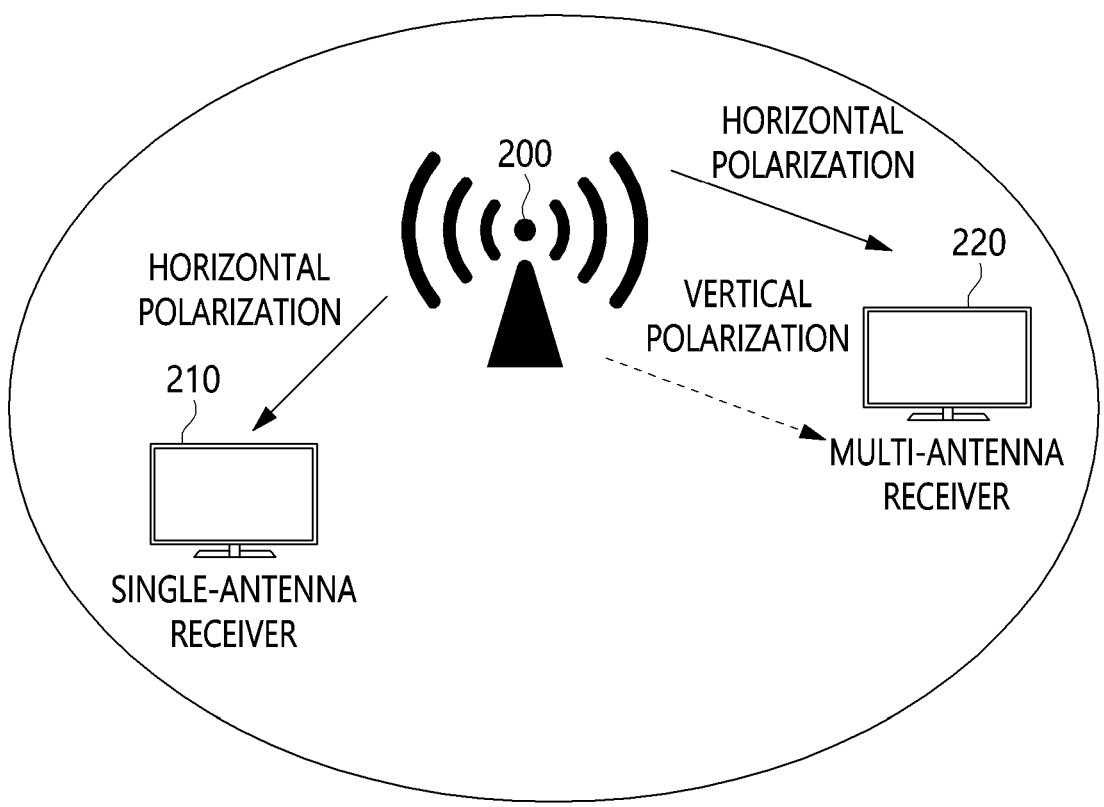
FIG. 2 is a diagram illustrating an example of a broadcast signal transmission/reception system according to the present invention.

FIG. 2 is a diagram illustrating an example of a broadcast signal transmission/reception system according to the present invention.

A next-generation terrestrial broadcasting system supports multi-antenna technology in which two antennas are used at each of a transmitting end and a receiving end. In this case, the two antennas may transmit and receive signals using different polarizations. Generally, an antenna based on a cross-polarization scheme may be assumed, wherein cross polarization is composed of horizontal polarization and vertical polarization.

Meanwhile, the signal of a next-generation terrestrial broadcasting system to which multi-antenna technology is not applied is transmitted using horizontal polarization. Therefore, when a terrestrial broadcasting system using multi-antenna technology is introduced, it may be assumed that a single antenna-based system receives only a horizontal polarization signal and a multi-antenna-based system receives both a horizontal polarization signal and a vertical polarization signal.

Referring to FIG. 2, a transmitter 200 may transmit a signal using multiple antennas.

Here, the signal transmitted through multiple antennas may be composed of a horizontal polarization signal and a vertical polarization signal.

The single-antenna receiver 210 may receive a horizontal polarization signal from the transmitter 200. The multi-antenna receiver 220 may receive both a horizontal polarization signal and a vertical polarization signal transmitted from the transmitter 200.

The broadcasting system may transmit and receive a broadcast signal by combining the multi-antenna transmission technology with layered-division multiplexing technology.

For example, the core layer may use single-antenna transmission technology. By means of this, backward compatibility of a single antenna-based broadcasting receiver may be guaranteed as the core layer. The enhanced layer may use multi-antenna transmission technology. By means of this, the quality of service provided through a multi-antenna-based broadcasting receiver may be improved.

Further, in provision of service by a broadcasting system in which multi-antenna transmission technology is combined with layered-division multiplexing technology, the corresponding service may be provided in association with scalable codec technology.

Here, the scalable codec technology may be classified into core media and enhanced media in a media encoding and decoding process.

For example, a receiver which receives only core media may provide only the core media. A receiver which receives core media and enhanced media may provide improved media using the core media and the enhanced media.

Here, in the provision of service by the system in which the multi-antenna transmission technology is combined with layered-division multiplexing technology, the core media of the scalable codec may be provided in the core layer of the system using a single-antenna transmission scheme.

Further, the enhanced media of the scalable codec may be provided in the enhanced layer of the system using a multi-antenna transmission scheme.

Therefore, a terminal which receives core media using a single antenna may provide the core media, and a terminal which receives a single antenna signal in the core layer and receives a multi-antenna signal in the enhanced layer may provide the enhanced media.

Figure 3:
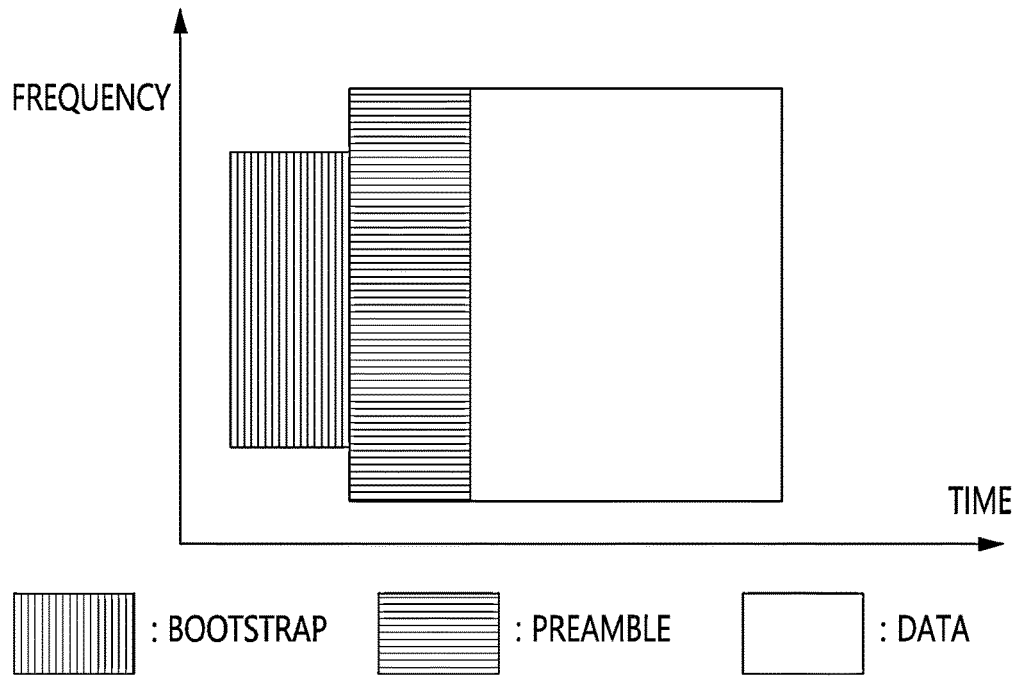
FIG. 3 is a diagram illustrating an example of signal configuration in a broadcasting system according to the present invention.

FIG. 3 is a diagram illustrating an example of signal configuration in a broadcasting system.

Referring to FIG. 3, a broadcast signal according to the present invention may be composed of a bootstrap, a preamble, and data (payload).

The bootstrap may be configured at a start point of a broadcast signal. Here, as illustrated in FIG. 3, the length of the bootstrap in a frequency domain may be configured to be less than that of the preamble or the data (payload).

The preamble may be configured after a bootstrap area, and the data may be configured after the preamble.

Here, the bootstrap and the preamble may be configured as signals for single-antenna transmission, but may not be included in signal configuration for multi-antenna transmission.

In other words, upon signal configuration in a single-antenna transmission scheme, a bootstrap and a preamble may be included, but the bootstrap and the preamble may not be included in signal configuration in a multi-antenna transmission scheme.

If the bootstrap and the preamble are transmitted through multiple antennas, the same signal may be transmitted through the multiple antennas.

Also, although the bootstrap and the preamble are configured as signals for single-layer transmission, they may not be included in signal configuration for layered-division multiplexing transmission.

In other words, the bootstrap and the preamble may be included in signal configuration in the case of a single-layer transmission scheme, but the bootstrap and the preamble may not be included in signal configuration in the case of a layered-division multiplexing transmission scheme.

Here, according to the present invention, when layered-division multiplexing and multi-antenna transmission are applied to the broadcasting system, horizontal polarization signals and vertical polarization signals may be configured differently.

For example, with the application of layered-division multiplexing, only a core layer signal may be transmitted, only an enhanced layer signal may be transmitted, or both a core layer signal and an enhanced layer signal may be transmitted. Furthermore, for the bootstrap, the preamble, and the data, signals may be transmitted using different transmission powers. A detailed signal configuration scheme thereof will be described in detail later with reference to FIGS. 6 to 9 and 14.

Figure 4:
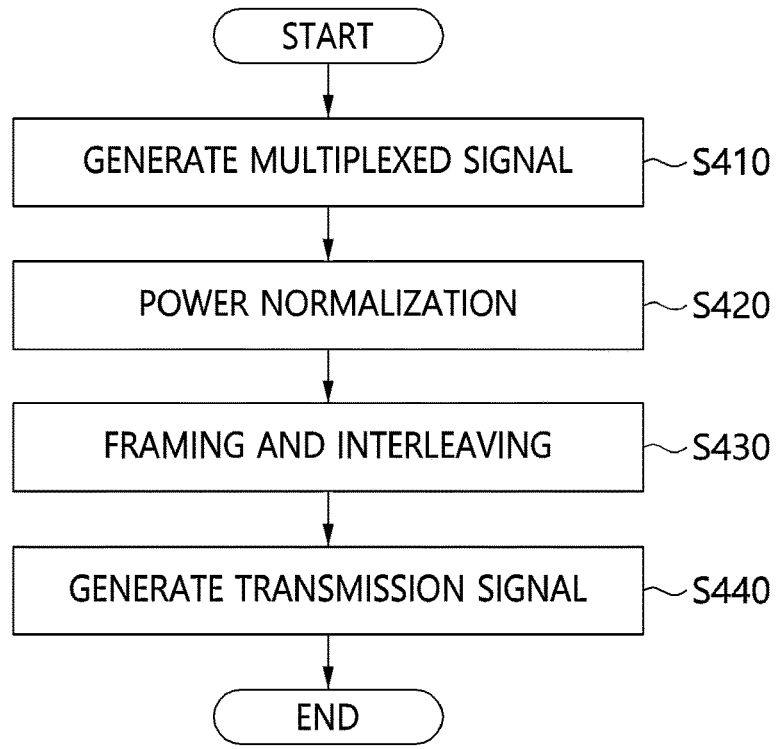
FIG. 4 is an operation flowchart illustrating a broadcast signal transmission method according to an embodiment of the present invention.

FIG. 4 is an operation flowchart illustrating a broadcast signal transmission method according to an embodiment of the present invention.

Figure 5:
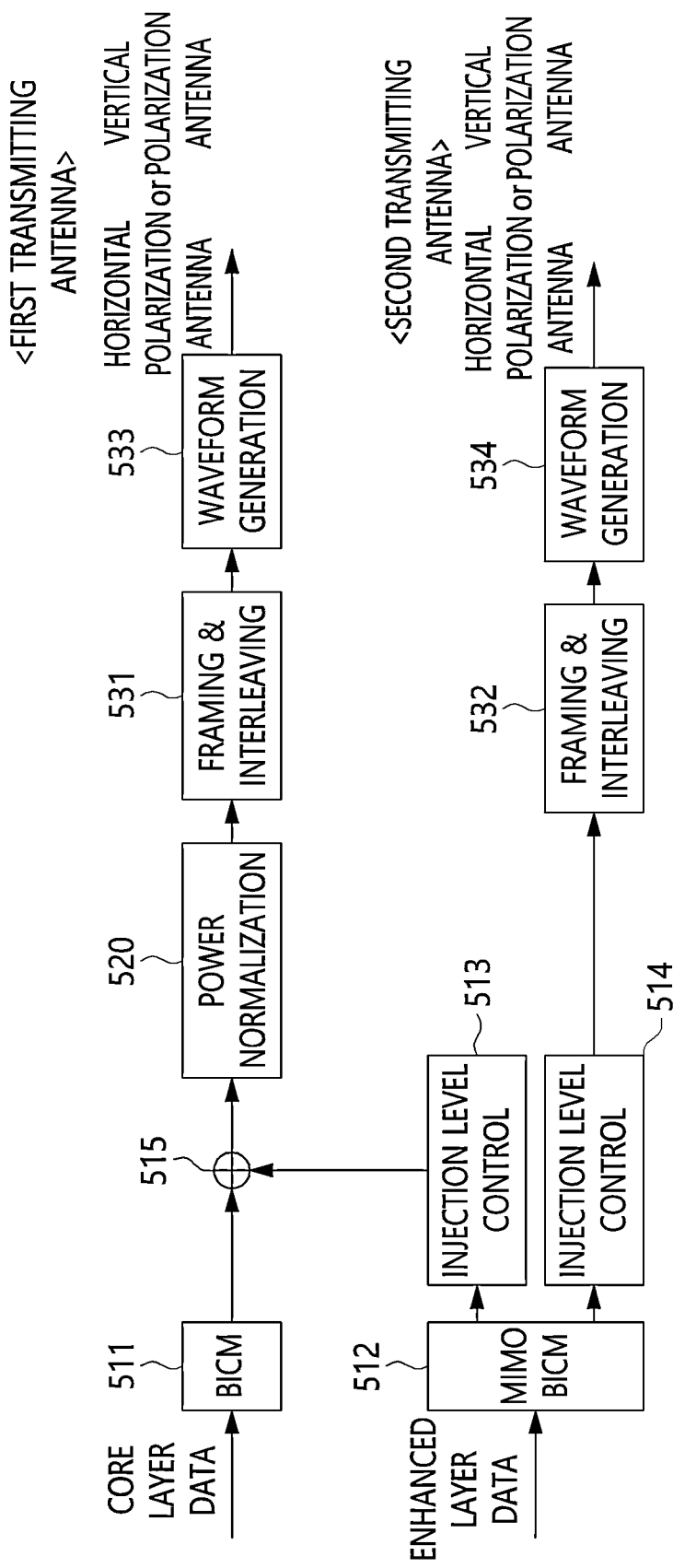
FIG. 5 is a diagram illustrating a broadcast signal transmission apparatus according to an embodiment of the present invention.

FIG. 5 is a diagram illustrating a broadcast signal transmission apparatus according to an embodiment of the present invention.

Hereinafter, a broadcast signal transmission process according to an embodiment of the present invention will be described in detail with reference to FIGS. 4 and 5.

First, referring to FIG. 4, the broadcast signal transmission method according to the embodiment of the present invention generates a multiplexed signal at step S410.

Referring to FIG. 5, a Bit-Interleaved Coded Modulation (BICM) unit 511 may receive core layer data, and may then generate a core layer signal.

Here, the BICM unit 511 may generate the core layer signal by performing channel coding, bit interleaving, and constellation mapping on the core layer data.

A Multiple-Input Multiple-Output (MIMO) BICM unit 512 may receive enhanced layer data (enhanced level data) and then generate two enhanced layer signals having different polarizations.

Here, the MIMO BICM unit 512 may generate the enhanced layer signals by performing channel coding, bit interleaving, MIMO demultiplexing, and constellation mapping on the enhanced layer data. That is, two output signals are produced while going through the MIMO BICM unit 512, wherein one output signal may correspond to a signal for horizontal polarization antenna transmission and the other output signal may correspond to a signal for vertical polarization antenna transmission.

The enhanced layer signals generated in this way may be input to injection level controllers 513 and 514, and thus transmission powers thereof may be controlled.

Here, each of the injection level controllers 513 and 514 may reduce the transmission power of the corresponding input enhanced layer signal by a preset transmission power offset (i.e., injection level).

For example, the injection level controller 513 may reduce the transmission power of a first enhanced layer signal corresponding to horizontal polarization, and the injection level controller 514 may reduce the transmission power of a second enhanced layer signal corresponding to vertical polarization.

In another example, the injection level controller 513 may reduce the transmission power of a first enhanced layer signal corresponding to vertical polarization, and the injection level controller 514 may reduce the transmission power of a second enhanced layer signal corresponding to horizontal polarization.

Thereafter, a combination unit 515 may generate a multiplexed signal corresponding to the first transmitting antenna by combining the core layer signal corresponding to the core layer data with the first enhanced layer signal.

In this case, because the first enhanced layer signal, the transmission power of which is controlled by the injection level controller 513, and the core layer signal have different transmission powers, the transmission power of the multiplexed signal may be normalized by a power normalization unit 520 at step S420.

Framing & interleaving units 531 and 532 may perform time interleaving, frame generation (including a preamble), and frequency interleaving on the multiplexed signal, the transmission power of which is normalized, and on the second enhanced layer signal, the transmission power of which is controlled by the injection level controller 514, respectively, at step S430.

Thereafter, waveform generation units 533 and 534 may generate a first transmission signal corresponding to the multiplexed signal and a second transmission signal corresponding to the second enhanced layer signal at step S440.

Here, the waveform generation units 533 and 534 may generate the first transmission signal and the second transmission signal by performing pilot insertion, Multi-Input Single-Output (MISO) signal processing, Inverse Fast Fourier Transform (IFFT), Peak to Average Power Ratio (PAPR) signal processing, guard interval insertion, bootstrap generation, etc.

The first transmission signal generated in this way may be transmitted through the first transmitting antenna, and the second transmission signal may be transmitted through the second transmitting antenna.

In this case, when the first enhanced layer signal is a horizontal polarization signal, the first transmitting antenna may correspond to a horizontal polarization antenna, whereas when the first enhanced layer signal is a vertical polarization signal, the first transmitting antenna may correspond to a vertical polarization antenna.

That is, in the present invention, the multiplexed signal may not be fixed to be transmitted only through the horizontal polarization antenna, and the core layer and the enhanced layer may transmit the multiplexed signal through the vertical polarization antenna.

For example, when the multiplexed signal is transmitted using the horizontal polarization antenna, the first enhanced layer signal corresponding to a horizontal polarization signal may be combined with the core layer signal, and then a combined signal may be transmitted through the first transmitting antenna corresponding to the horizontal polarization antenna. Further, when the multiplexed signal is transmitted using the vertical polarization antenna, the first enhanced layer signal corresponding to a vertical polarization signal may be combined with the core layer signal, and then a combined signal may be transmitted through the first transmitting antenna corresponding to the vertical polarization antenna.

The first transmission signal and the second transmission signal generated by the broadcast signal transmission apparatus, illustrated in FIG. 5, may be configured, as illustrated in FIGS. 6 to 9.

Referring to FIGS. 6 to 9, it can be seen that transmission power of data included in the second transmission signal that is transmitted through the second transmitting antenna depending on the layered-division multiplexing scheme is lower than the transmission power of data included in the first transmission signal that is transmitted through the first transmitting antenna by a preset transmission power offset (injection level).

Here, polarization of the antenna for transmitting the first transmission signal and polarization of the antenna for transmitting the second transmission signal may be different from each other. That is, when the first transmission signal is transmitted through the horizontal polarization antenna, the second transmission signal may be transmitted through the vertical polarization antenna, whereas when the first transmission signal is transmitted through the vertical polarization antenna, the second transmission signal may be transmitted through the horizontal polarization antenna.

Here, the first transmission signal may include a first bootstrap, a first preamble and first data, and transmission powers of the first bootstrap, the first preamble, and the first data may be identical to each other.

Figure 6:
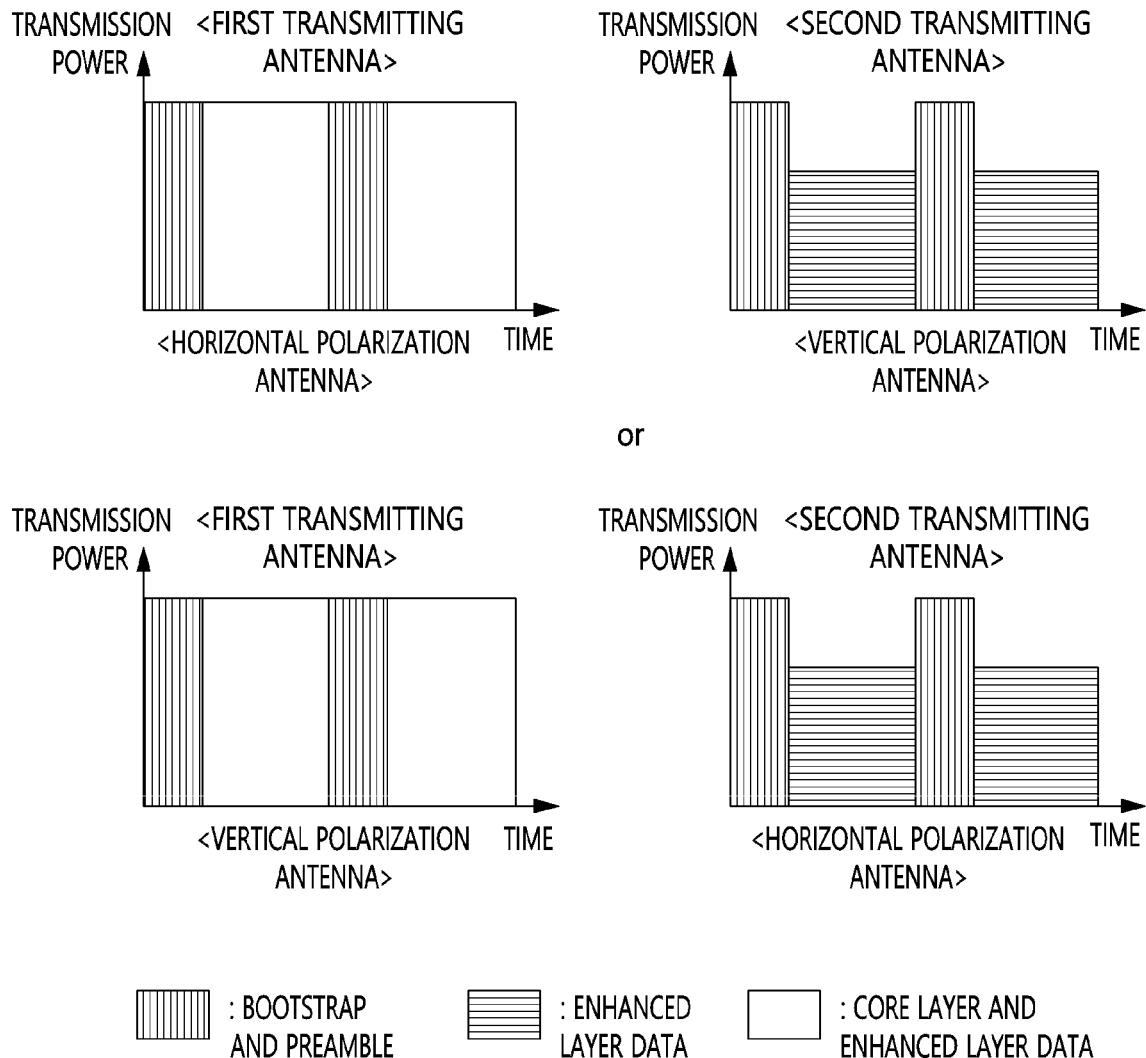
FIGS. 6, 7, 8, and 9 are diagrams illustrating an example of transmission signal configuration according to the present invention.
Figure 7:
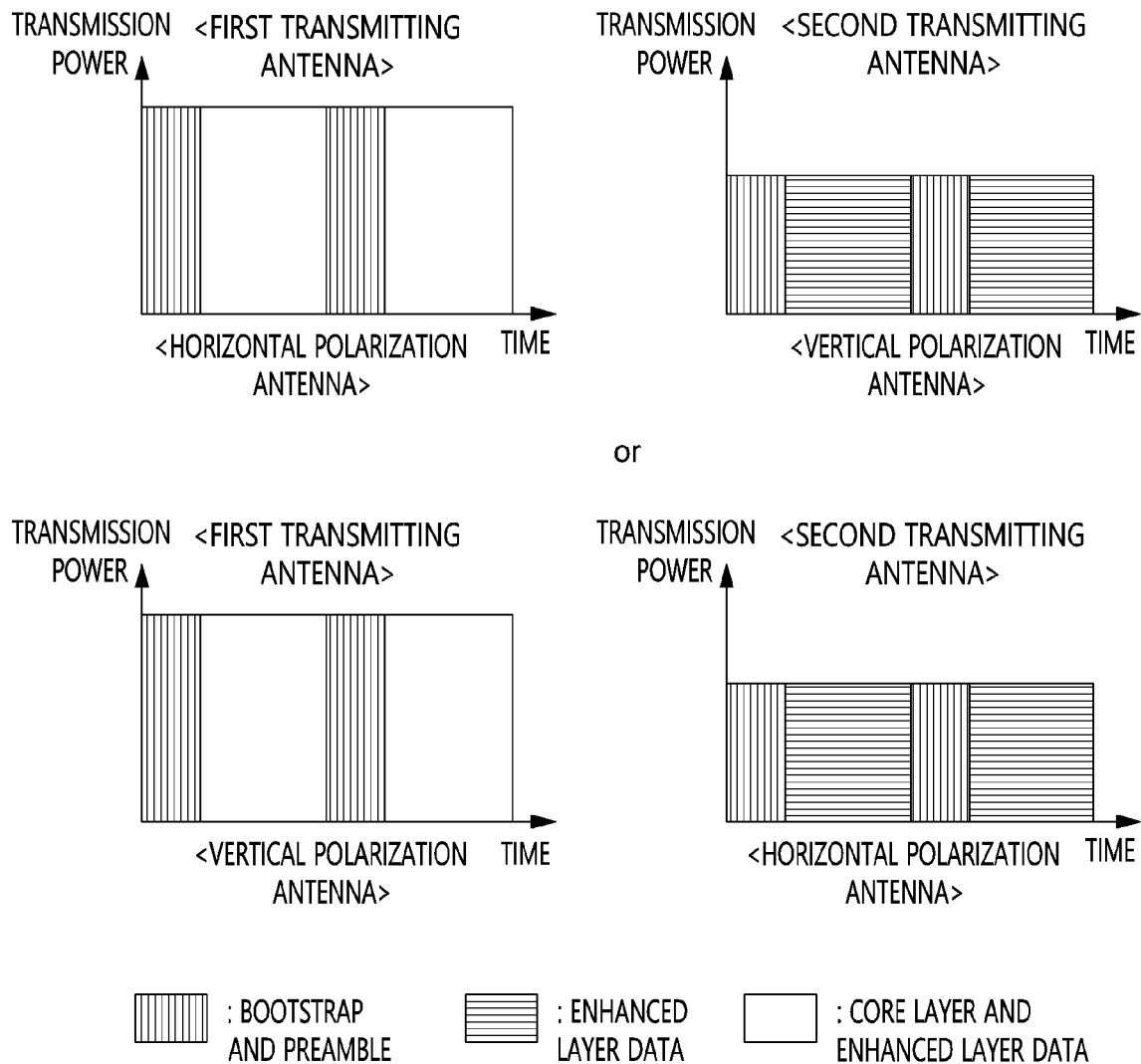

Here, as illustrated in FIGS. 6 and 7, when a second bootstrap and a second preamble are included in the second transmission signal, the transmission powers of the second bootstrap and the second preamble may be lower than the transmission power of the first transmission signal by a preset transmission power offset (injection level).

For example, referring to FIG. 6, the first transmitting antenna may transmit a first transmission signal composed of a bootstrap, a preamble, and data. The data of the first transmission signal may be obtained by combining core layer data with enhanced layer data. As illustrated in FIG. 6, the bootstrap, the preamble, and the data may be transmitted at the same transmission power through the first transmitting antenna.

The second transmitting antenna of FIG. 6 may transmit a second transmission signal composed of a bootstrap, a preamble, and data. The data of the second transmission signal may include only enhanced layer data (enhanced level data). Further, as illustrated in FIG. 6, the bootstrap and the preamble may be transmitted at the same transmission power through the second transmitting antenna.

However, the bootstrap, the preamble, and data may be transmitted through the second transmitting antenna so that the transmission power of the bootstrap and the preamble and the transmission power of the data are different from each other. In this case, the bootstrap, the preamble, and data may be transmitted through the second transmitting antenna so that the transmission power of data is lower than that of the bootstrap and the preamble. In an example, the bootstrap, the preamble, and data may be transmitted such that the transmission power of the data is lower than that of the bootstrap and the preamble by a transmission power offset.

In another example, referring to FIG. 7, the first transmitting antenna may transmit a first transmission signal composed of a bootstrap, a preamble, and data. The data of the first transmission signal may be obtained by combining core layer data with enhanced layer data. As illustrated in FIG. 7, the bootstrap, the preamble, and the data may be transmitted at the same transmission power through the first transmitting antenna.

The second transmitting antenna of FIG. 7 may transmit a second transmission signal composed of a bootstrap, a preamble, and data. The data of the second transmission signal may include only enhanced layer data. As illustrated in FIG. 7, the bootstrap, the preamble, and the data may be transmitted at the same transmission power through the second transmitting antenna.

However, the transmission power of the bootstrap, preamble, and data transmitted through the second transmitting antenna may be different from that of the bootstrap, preamble, and data transmitted through the first transmitting antenna. In this case, the transmission power of the bootstrap, preamble, and data transmitted through the second transmitting antenna may be lower than the transmission power of the bootstrap, preamble, and data transmitted through the first transmitting antenna. For example, the transmission power of the bootstrap, preamble, and data transmitted through the second transmitting antenna may be lower than the transmission power of the bootstrap, preamble, and data transmitted through the first transmitting antenna by a transmission power offset.

Here, a second bootstrap and a second preamble may not be included in the second transmission signal.

Figure 8:
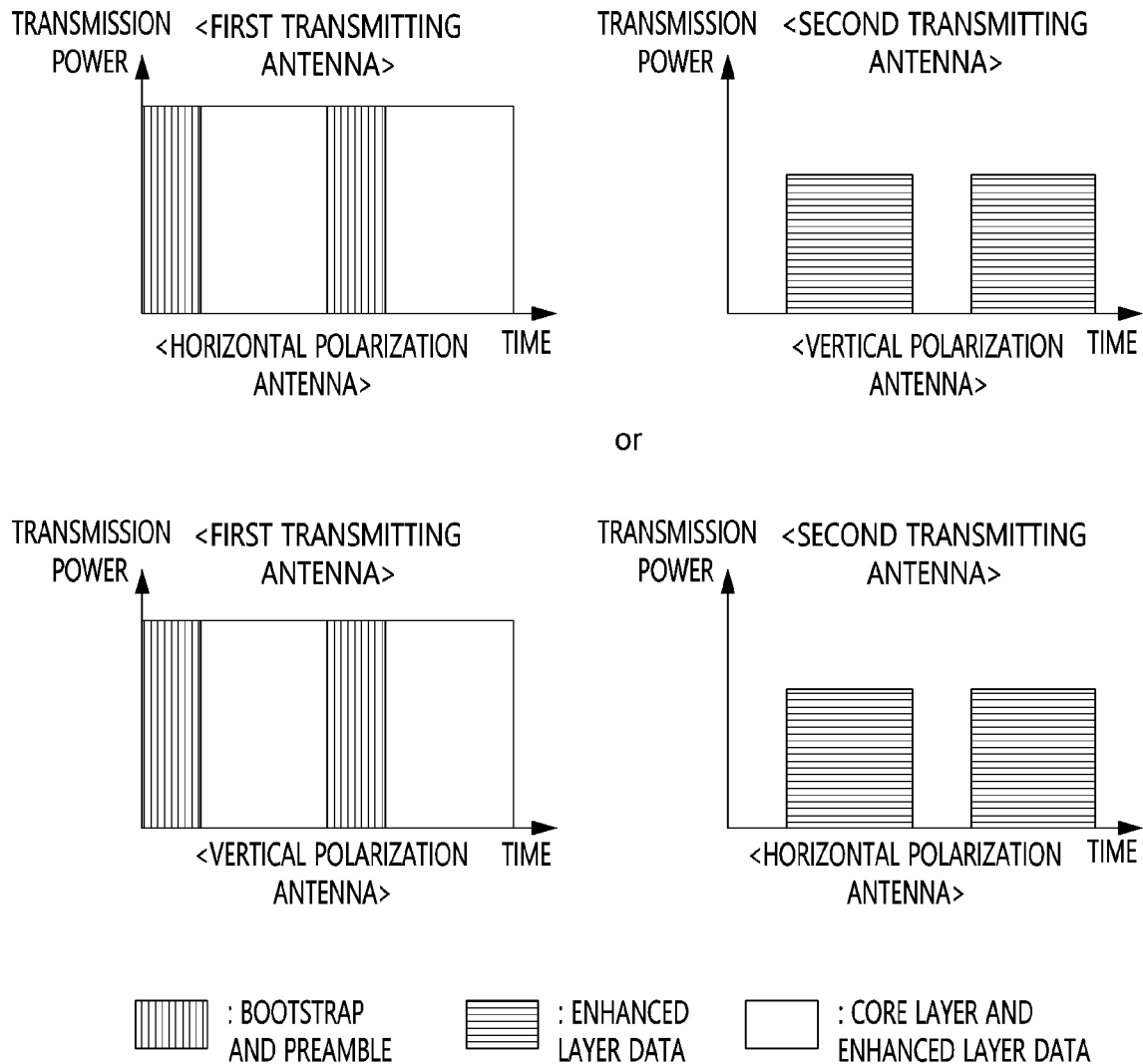

For example, referring to FIG. 8, the first transmitting antenna may transmit a first transmission signal composed of a bootstrap, a preamble, and data. The data of the first transmission signal may be obtained by combining core layer data with enhanced layer data. As illustrated in FIG. 8, the bootstrap, the preamble, and the data may be transmitted at the same transmission power through the first transmitting antenna.

The second transmitting antenna of FIG. 8 may transmit a second transmission signal composed of only data. That is, the second transmitting antenna may transmit neither a bootstrap nor a preamble. Here, the data of the second transmission signal may include only enhanced layer data.

Furthermore, transmission power of data transmitted through the second transmitting antenna may be different from that of data transmitted through the first transmitting antenna. In this case, the transmission power of data transmitted through the second transmitting antenna may be lower than that of data transmitted through the first transmitting antenna. For example, the transmission power of data transmitted through the second transmitting antenna may be lower than that of data transmitted through the first transmitting antenna by a transmission power offset.

Figure 9:
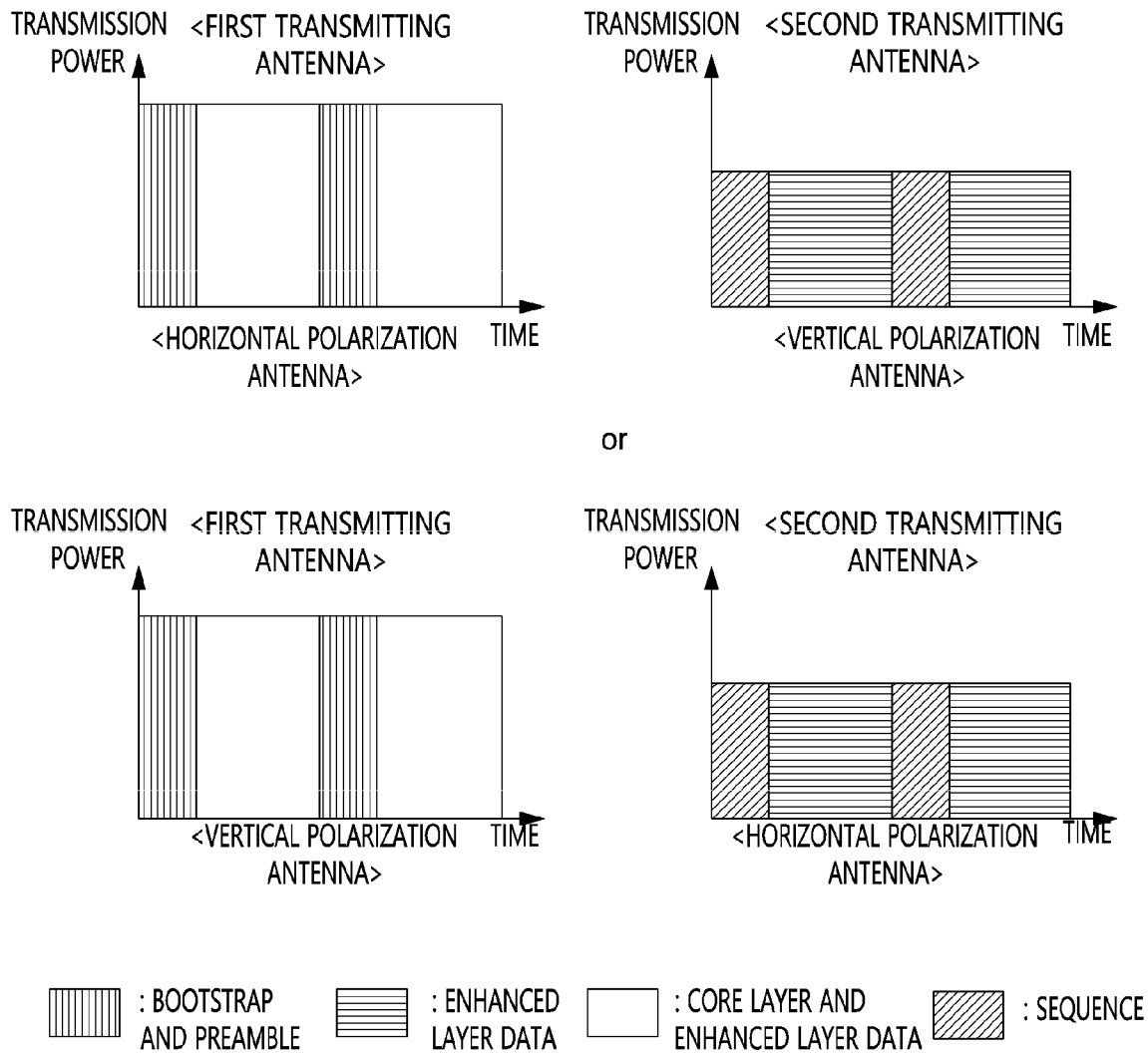

In this case, when a second bootstrap and a second preamble are not included in the second transmission signal, the second transmission signal may be transmitted to include a sequence having transmission power identical to that of the second data included in the second transmission signal, as illustrated in FIG. 9.

For example, referring to FIG. 9, the first transmitting antenna may transmit a first transmission signal composed of a bootstrap, a preamble, and data. The data of the first transmission signal may be obtained by combining core layer data with enhanced layer data. As illustrated in FIG. 9, the bootstrap, the preamble, and the data may be transmitted at the same transmission power through the first transmitting antenna.

The second transmitting antenna of FIG. 9 may transmit a second transmission signal composed of a sequence and data. The data of the second transmission signal may include only enhanced layer data. The sequence of the second transmission signal may be a binary sequence composed of 0 and 1. For example, the sequence may be a pseudorandom binary sequence generated based on a specific procedure.

Here, the sequence may be transmitted through the second transmitting antenna at a time point at which the bootstrap and the preamble are transmitted through the first transmitting antenna. The sequence and the data may be transmitted at the same transmission power through the second transmitting antenna.

Further, the transmission power of the sequence and data transmitted through the second transmitting antenna may be different from that of the bootstrap, the preamble, and the data transmitted through the first transmitting antenna. In this case, the transmission power of the sequence and the data transmitted through the second transmitting antenna may be lower than the transmission power of the bootstrap, the preamble, and the data transmitted through the first transmitting antenna. For example, the transmission power of the sequence and data transmitted through the second transmitting antenna may be lower than the transmission power of the bootstrap, the preamble, and the data transmitted through the first transmitting antenna by a transmission power offset.

In this way, the next-generation terrestrial broadcasting system may improve the performance of a broadcasting system using multiple antennas by transmitting a broadcast signal based on the multiple antennas and layered-division multiplexing technology.

Further, broadcast signal transmission technology may be provided in a multi-antenna system to which layered-division multiplexing is applied.

Figure 10:
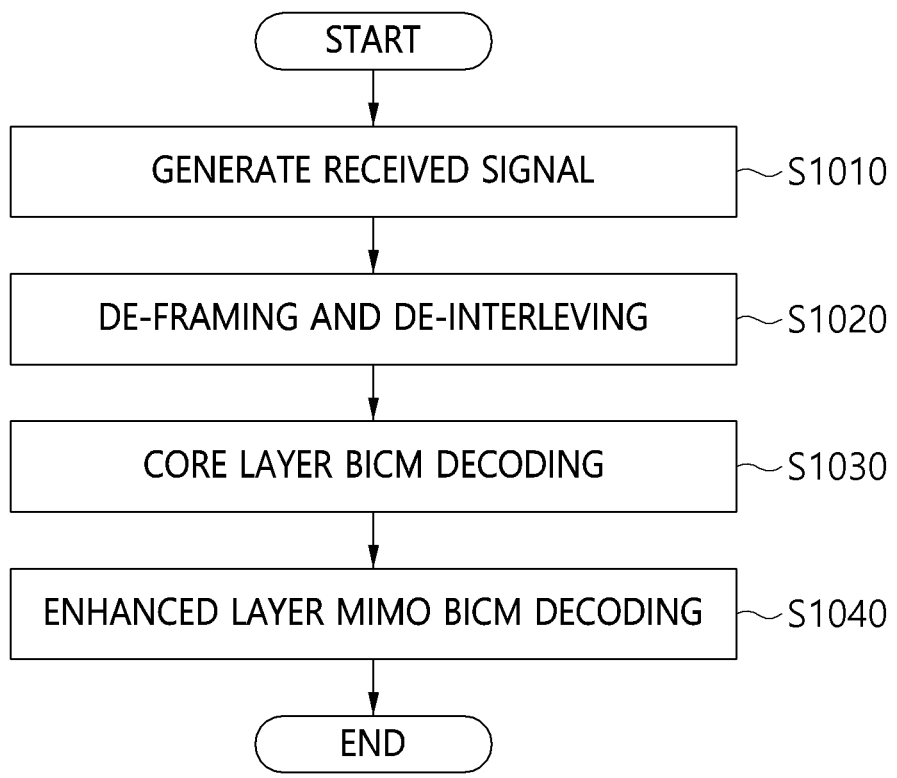
FIG. 10 is an operation flowchart illustrating a broadcast signal reception method according to an embodiment of the present invention.

FIG. 10 is an operation flowchart illustrating a broadcast signal reception method according to an embodiment of the present invention.

Figure 11:
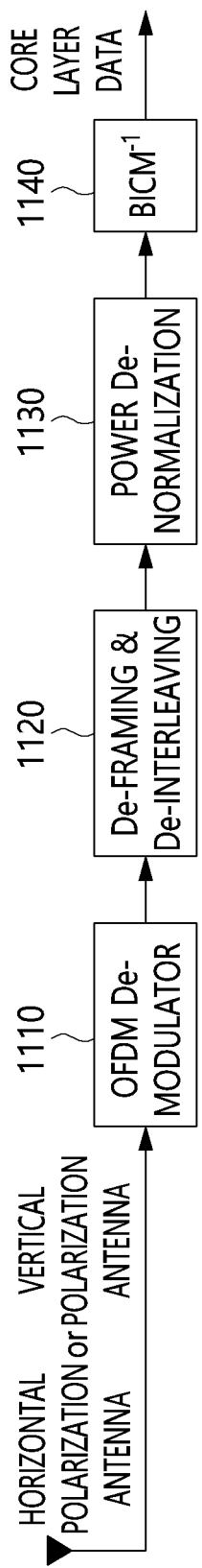
FIG. 11 is a block diagram illustrating an example of a broadcast signal reception apparatus equipped with a single antenna.

FIG. 11 is a block diagram illustrating an example of a broadcast signal reception apparatus equipped with a single antenna.

Figure 12:
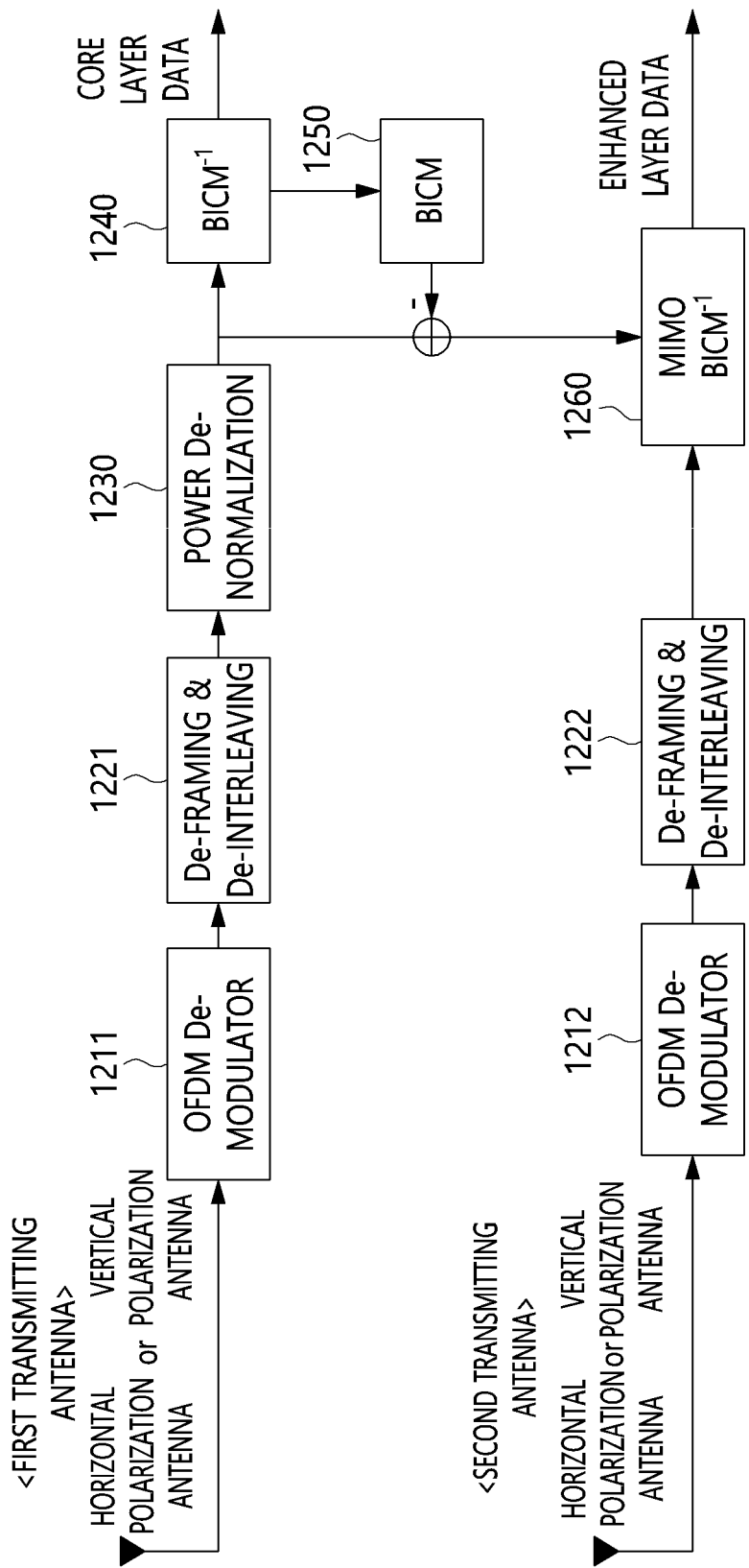
FIG. 12 is a block diagram illustrating an example of a broadcast signal reception apparatus according to the present invention.

FIG. 12 is a block diagram illustrating an example of a broadcast signal reception apparatus according to the present invention.

Hereinafter, a broadcast signal reception process according to an embodiment of the present invention will be described in detail with reference to FIGS. 10 to 12.

First, a signal processing flow in a broadcast signal reception apparatus having a structure in which any one of a horizontal polarization antenna and a vertical polarization antenna is provided to receive only core layer data will be described below with reference to FIG. 11.

Referring to FIG. 11, the broadcast signal reception apparatus or reception terminal receives a signal through a horizontal polarization antenna or a vertical polarization antenna.

Thereafter, an Orthogonal Frequency-Division Multiplexing (OFDM) demodulator 1110 may perform OFDM signal demodulation on the received signal. Here, OFDM signal demodulation may include bootstrap removal, guard interval removal, a PAPR inverse operation, a Fast Fourier Transform (FFT) operation, a MISO inverse operation, and channel estimation.

Thereafter, a deframing & deinterleaving unit 1120 may perform a frequency deinterleaving operation, preamble removal, and a time deinterleaving operation on the received signal.

Thereafter, a power denormalization unit 1130 may perform an inverse operation of transmission power normalization on the received signal.

Thereafter, a BICM$^{-1}$ unit 1140 may estimate core layer data by performing channel decoding, bit interleaving, and constellation demapping.

Here, the structure of the broadcast signal reception apparatus illustrated in FIG. 11 may be utilized in the case where a core layer signal is not transmitted and an enhanced layer signal is transmitted through the second transmitting antenna, as shown in FIG. 5.

Hereinafter, a process of receiving a broadcast signal using multiple antennas and layered-division multiplexing will be described in detail with reference to FIGS. 10 to 12.

First, referring to FIG. 10, the broadcast signal reception method according to an embodiment of the present invention generates received signals at step S1010.

Referring to FIG. 12, OFDM demodulators 1211 and 1212 may generate received signals by performing an OFDM signal demodulation procedure on signals received through a first receiving antenna and a second receiving antenna.

Here, when the first receiving antenna is a horizontal polarization antenna, the second receiving antenna may correspond to a vertical polarization antenna, whereas when the first receiving antenna is a vertical polarization antenna, the second receiving antenna may correspond to a horizontal polarization antenna.

Here, the OFDM demodulators 1211 and 1212 may generate the received signals by performing bootstrap removal, guard interval removal, a PAPR inverse operation, an FFT operation, a MISO inverse operation, and channel estimation.

Thereafter, deframing & deinterleaving units 1221 and 1222 may perform a frequency deinterleaving operation, preamble removal, and a time deinterleaving operation on the received signals at step S1020.

Thereafter, a core layer signal corresponding to the signal received through the first receiving antenna is reconstructed at step S1030.

Here, the core layer signal may be reconstructed through the same signal flow as that in the structure described in FIG. 11.

Next, an enhanced layer signal is reconstructed (decoded) based on both a first enhanced layer signal in which the core layer signal is removed from the signal received through the first receiving antenna and a second enhanced layer signal received through the second receiving antenna at step S1040.

Here, a cancellation signal may be generated by performing channel coding, bit interleaving, and constellation mapping on the reconstructed core layer signal, and a first enhanced layer signal may be extracted by removing the cancellation signal from the signal received through the first receiving antenna.

For example, a cancellation signal corresponding to the core layer signal, received through the first receiving antenna, may be generated by inputting core layer data, which is estimated by the BICM$^{-1}$ unit 1240 shown in FIG. 12, to the same BICM unit 1250 as that used in a transmitting end. In this case, because the signal output through a power denormalization unit 1230 is a signal in which the core layer signal, received through the first receiving antenna, is combined with the first enhanced layer signal, only the first enhanced layer signal received through the second receiving antenna may be extracted by removing the cancellation signal (core layer signal) from the corresponding signal.

(core layer signal+first enhanced layer signal)−cancellation signal=first enhanced layer signal Thereafter, a single enhanced layer signal may be reconstructed by performing channel decoding, bit deinterleaving, MIMO multiplexing, and constellation demapping on the second enhanced layer signal, which is output through the deframing & deinterleaving unit 1222 illustrated in FIG. 12, and on the extracted first enhanced layer signal, and then the first enhanced layer data may be estimated.

That is, as illustrated in FIG. 12, the enhanced layer data may be estimated by inputting both the first enhanced layer signal, which is received through the first receiving antenna, and the second enhanced layer signal, which is received through the second receiving antenna, to a MIMO BICM$^{-1}$ unit 1260.

Here, the structure of the broadcast signal reception apparatus illustrated in FIG. 12 may be utilized in the case where a core layer signal is not transmitted and an enhanced layer signal is transmitted through the second transmitting antenna, as shown in FIG. 5.

In this way, the next-generation terrestrial broadcasting system may improve the performance of a broadcasting system using multiple antennas by receiving a broadcast signal based on the multiple antennas and layered-division multiplexing technology.

Further, broadcast signal reception technology may be provided in a multi-antenna system to which layered-division multiplexing is applied.

Figure 13:
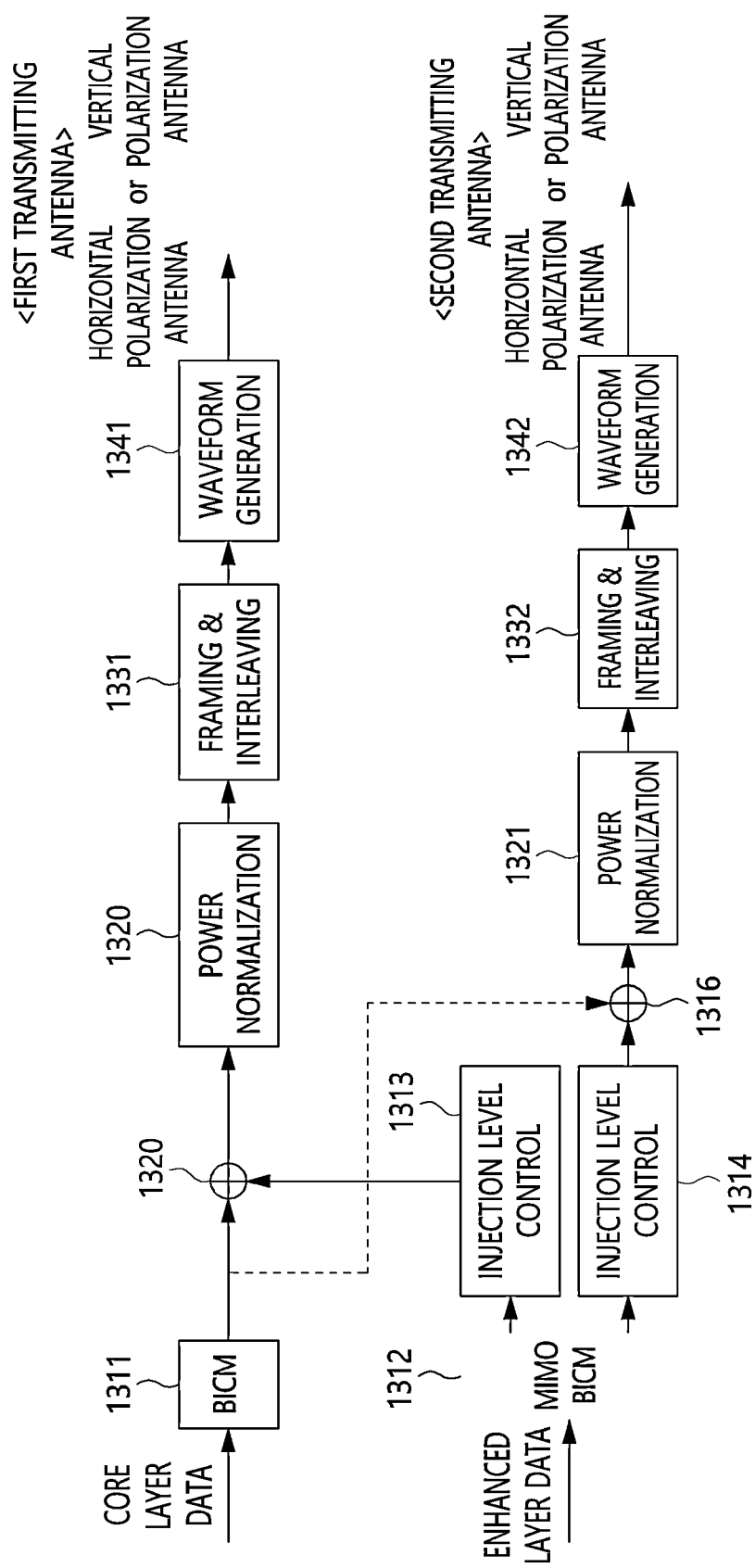
FIG. 13 is a block diagram illustrating another example of a broadcast signal transmission apparatus according to the present invention.

FIG. 13 is a block diagram illustrating another example of a broadcast signal transmission apparatus according to the present invention.

Referring to FIG. 13, a Bit-Interleaved Coded Modulation (BICM) unit 1311 may receive core layer data, and may then generate a core layer signal.

Here, the BICM unit 1311 may generate the core layer signal by performing channel coding, bit interleaving, and constellation mapping on the core layer data.

A MIMO BICM unit 1312 may generate two enhanced layer signals having different polarizations by receiving enhanced layer data.

Here, the MIMO BICM unit 1312 may generate the enhanced layer signals by performing channel coding, bit interleaving, MIMO demultiplexing, and constellation mapping on the enhanced layer data. That is, two output signals are produced while going through the MIMO BICM unit 1312, wherein one output signal may correspond to a signal for horizontal polarization antenna transmission and the other output signal may correspond to a signal for vertical polarization antenna transmission.

The enhanced layer signals generated in this way may be input to injection level controllers 1313 and 1314, and transmission powers thereof may be controlled.

Here, each of the injection level controllers 1313 and 1314 may reduce the transmission power of the corresponding input enhanced layer signal by a transmission power offset (i.e., an injection level).

For example, the injection level controller 1313 may reduce the transmission power of a first enhanced layer signal corresponding to horizontal polarization, and the injection level controller 1314 may reduce the transmission power of a second enhanced layer signal corresponding to vertical polarization.

In another example, the injection level controller 1313 may reduce the transmission power of a first enhanced layer signal corresponding to vertical polarization, and the injection level controller 1314 may reduce the transmission power of a second enhanced layer signal corresponding to horizontal polarization.

A combination unit 1315 may generate a first multiplexed signal corresponding to the first transmitting antenna by combining the core layer signal corresponding to core layer data with the first enhanced layer signal.

A combination unit 1316 may generate a second multiplexed signal corresponding to the second transmitting antenna by combining the core layer signal corresponding to the core layer data with the second enhanced layer signal.

Here, because the first enhanced layer signal, the transmission power of which is controlled by the injection level controller 1313, and the second enhanced layer signal, the transmission power of which is controlled by the injection level controller 1314, have transmission powers different from that of the core layer signal, the transmission powers of the first multiplexed signal and the second multiplexed signal may be normalized through power normalization units 1320 and 1321.

Framing & interleaving units 1331 and 1332 may perform time interleaving, frame generation (including a preamble), and frequency interleaving on the first multiplexed signal and the second multiplexed signal, respectively, the transmission powers of which are normalized.

Waveform generation units 1341 and 1342 may generate a first transmission signal corresponding to the first multiplexed signal and a second transmission signal corresponding to the second multiplexed signal.

Here, the waveform generation units 1341 and 1342 may generate the first transmission signal and the second transmission signal by performing pilot insertion, MISO signal processing, IFFT, Peak to Average Power Ratio (PAPR) signal processing, guard interval insertion, bootstrap generation, etc.

The first transmission signal generated in this way may be transmitted through the first transmitting antenna, and the second transmission signal may be transmitted through the second transmitting antenna.

Here, the first transmitting antenna may correspond to a horizontal polarization antenna or a vertical polarization antenna, and the first transmitting antenna and the second transmitting antenna may correspond to antennas having different polarizations.

For example, when the first transmitting antenna is a horizontal polarization antenna and the second transmitting antenna is a vertical polarization antenna, the first transmission signal may be generated to correspond to a horizontal polarization signal, and the second transmission signal may be generated to correspond to a vertical polarization signal. Further, when the first transmitting antenna is a vertical polarization antenna and the second transmitting antenna is a horizontal polarization antenna, the first transmission signal may be generated to correspond to a vertical polarization signal, and the second transmission signal may be generated to correspond to a horizontal polarization signal.

Figure 14:
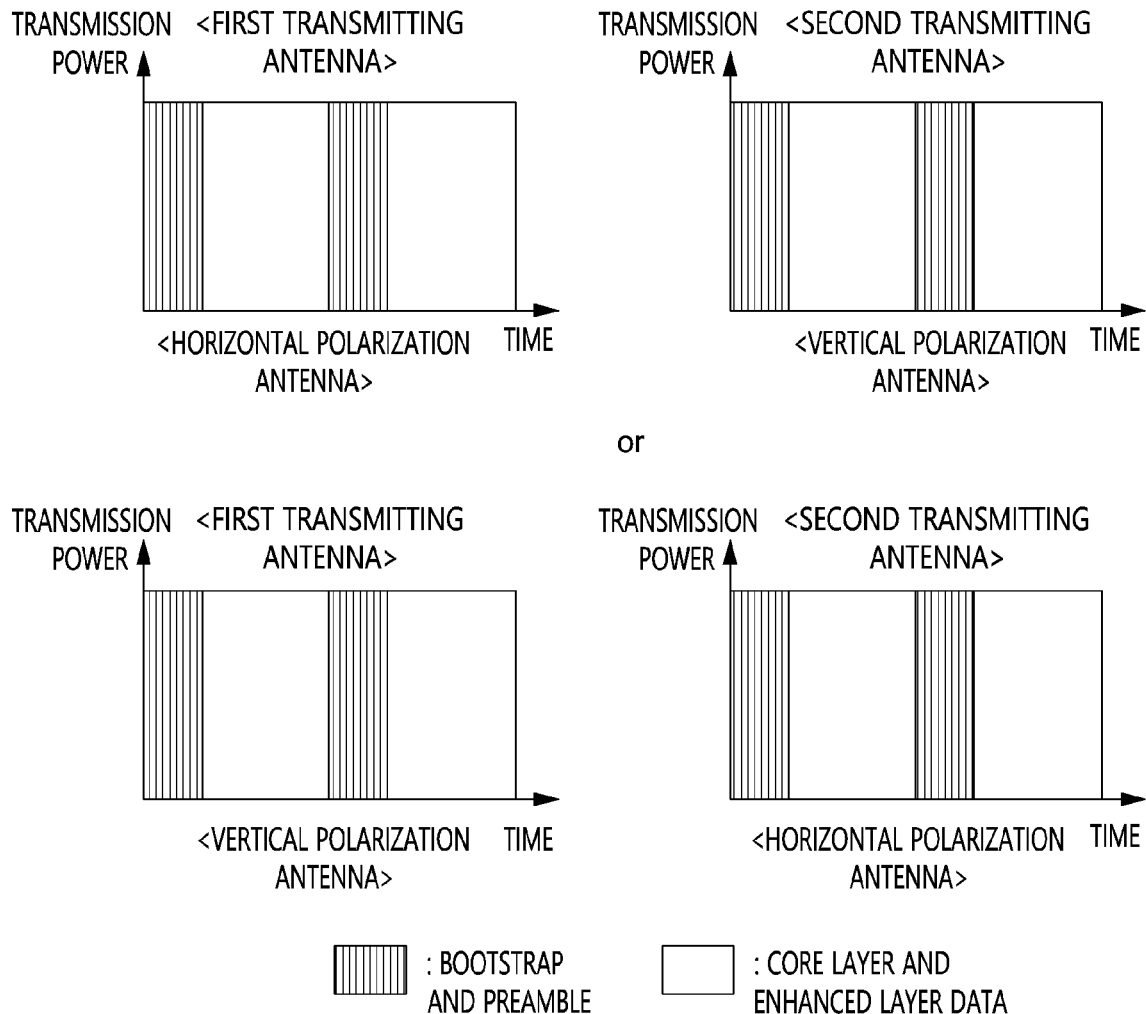
FIG. 14 is a diagram illustrating another example of transmission signal configuration according to the present invention.

The first transmission signal and the second transmission signal generated through the broadcast signal transmission apparatus, illustrated in FIG. 13, may be configured, as illustrated in FIG. 14.

For example, referring to FIG. 14, the first transmitting antenna may transmit a first transmission signal composed of a bootstrap, a preamble, and data. The data of the first transmission signal may be obtained by combining core layer data with first enhanced layer data. As illustrated in FIG. 14, the bootstrap, the preamble, and the data may be transmitted at the same transmission power through the first transmitting antenna.

The second transmitting antenna of FIG. 14 may transmit a second transmission signal composed of a bootstrap, a preamble, and data. The data of the second transmission signal may be obtained by combining core layer data with second enhanced layer data. The bootstrap, preamble, and data may also be transmitted at the same transmission power through the second transmitting antenna.

Further, the bootstrap, preamble, and data transmitted through the second transmitting antenna may have the same transmission power as the bootstrap, preamble, and data transmitted through the first transmitting antenna.

Hereinafter, a process of receiving a broadcast signal transmitted in the process of FIG. 13 will be described in detail with reference to FIGS. 15 and 16.

Figure 15:
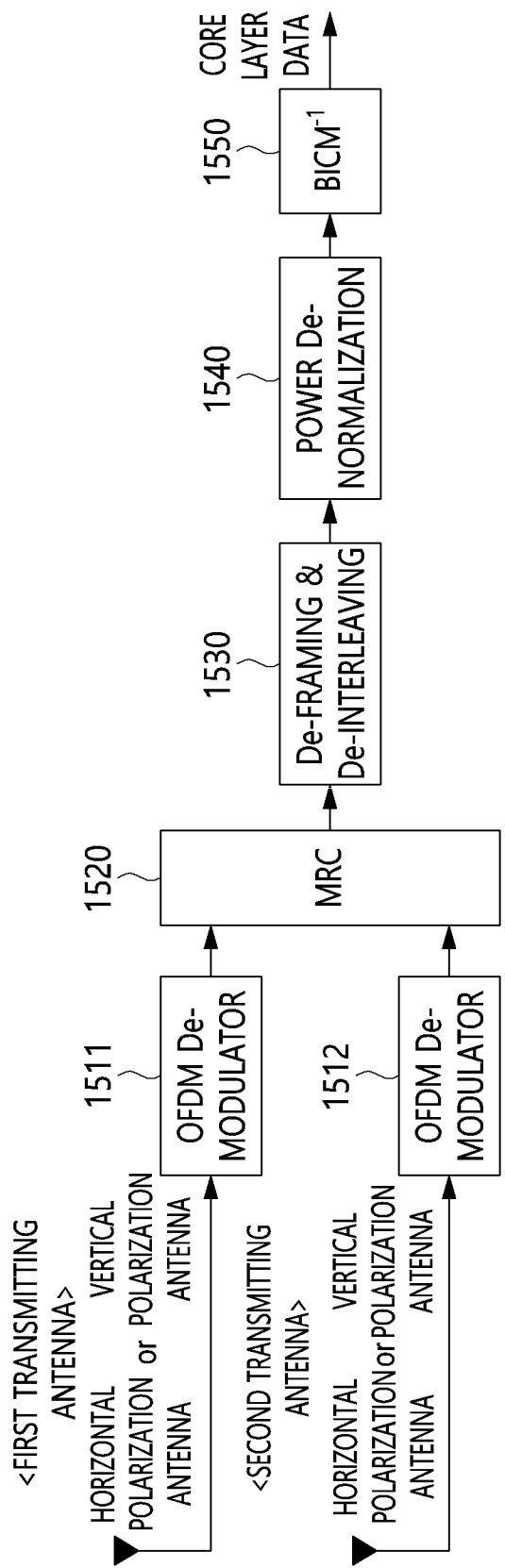
FIGS. 15 and 16 are block diagrams illustrating another example of a broadcast signal reception apparatus according to the present invention.

First, referring to FIG. 15, the broadcast signal reception apparatus or broadcast signal reception terminal may receive signals through a first receiving antenna and a second receiving antenna.

Here, the first receiving antenna and the second receiving antenna may be antennas corresponding to different polarizations. Here, when the first receiving antenna is a horizontal polarization antenna, the second receiving antenna may correspond to a vertical polarization antenna, whereas when the first receiving antenna is a vertical polarization antenna, the second receiving antenna may correspond to a horizontal polarization antenna.

Orthogonal Frequency-Division Multiplexing (OFDM) demodulators 1511 and 1512 may perform OFDM signal demodulation on the received signals. Here, OFDM signal demodulation may include bootstrap removal, guard interval removal, PAPR inverse operation, an FFT operation, a MISO inverse operation, and channel estimation.

A Maximal Ratio Combining (MRC) unit 1520 may perform MRC on the OFDM demodulated signals.

Thereafter, core layer data may be estimated by performing deframing & deinterleaving, power denormalization, and BICM inverse operation on an MRC-processed signal through a deframing & deinterleaving unit 1530, a power denormalization unit 1540, and a $BICM^{-1}$ unit 1550.

Figure 16:
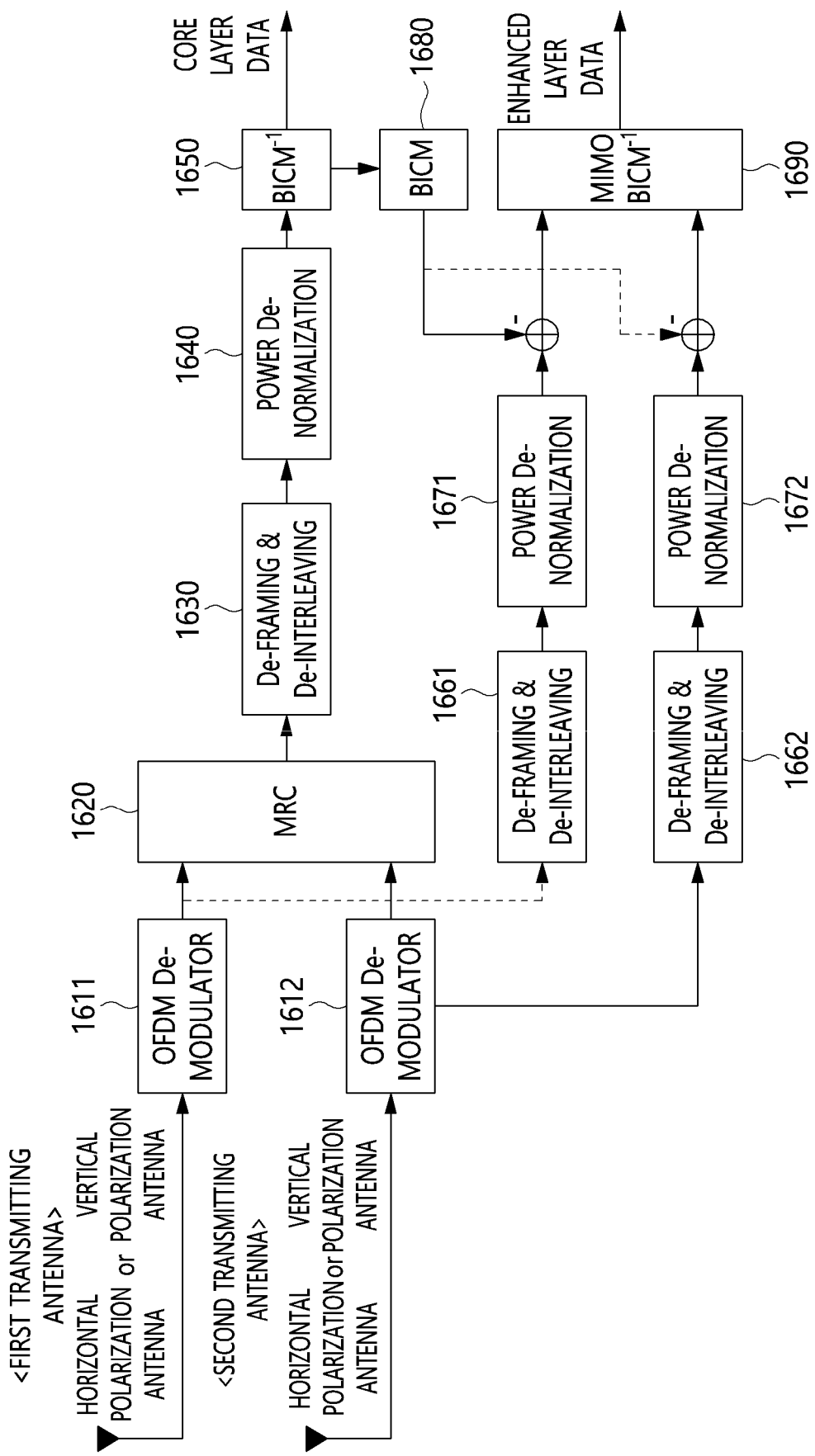

Furthermore, referring to FIG. 16, the broadcast signal reception apparatus or broadcast signal reception terminal may receive signals through a first receiving antenna and a second receiving antenna.

Here, the first receiving antenna and the second receiving antenna may be antennas corresponding to different polarizations. Here, when the first receiving antenna is a horizontal polarization antenna, the second receiving antenna may correspond to a vertical polarization antenna, whereas when the first receiving antenna is a vertical polarization antenna, the second receiving antenna may correspond to a horizontal polarization antenna.

OFDM demodulators 1611 and 1612 may perform OFDM signal demodulation on the received signals. Here, core layer data may be estimated in the same manner as the structure described in FIG. 15.

Thereafter, a core layer received signal corresponding to a cancellation signal may be generated by inputting the estimated core layer data to a BICM unit 1680.

Thereafter, a first enhanced layer signal and a second enhanced layer signal may be extracted by subtracting the cancellation signal from the signals generated after going through the OFDM demodulators 1611 and 1612, deframing & deinterleaving units 1661 and 1662, and power denormalization units 1671 and 1672.

Thereafter, enhanced layer data may be estimated by inputting the first enhanced layer signal and the second enhanced layer signal to a MIMO BCIM-1 unit 1690.

In this case, the structures of the broadcast signal reception apparatus illustrated in FIGS. 15 and 16 may be utilized in the case where a core layer signal and an enhanced layer signal are transmitted through a horizontal polarization antenna and a vertical polarization antenna or through a vertical polarization antenna and a horizontal polarization antenna, as shown in FIG. 13.

In accordance with the present invention, the performance of a broadcasting system using multiple antennas may be improved.

Further, the present invention may provide technology for transmitting and receiving a broadcast signal in a multi-antenna system to which layered-division multiplexing is applied.

As described above, in the broadcast signal transmission/reception method using multiple antennas and layered-division multiplexing and the apparatus for the broadcast signal transmission/reception method according to the present invention, the configurations and schemes in the above-described embodiments are not limitedly applied, and some or all of the above embodiments can be selectively combined and configured such that various modifications are possible.

What is claimed is:
1. A broadcast signal transmission apparatus, comprising:
 a Multiple-Input Multiple-Output (MIMO) Bit-Interleaved Coded Modulation (BICM) unit for dividing enhanced layer data into two enhanced layer signals having different polarizations;
 a combination unit for generating a multiplexed signal corresponding to a first transmitting antenna by combining a core layer signal corresponding to core layer data with a first enhanced layer signal;

a first transmission signal generation unit for generating a first transmission signal corresponding to the multiplexed signal and transmitted through the first transmitting antenna, and a second transmission signal generation unit for generating a second transmission signal corresponding to a second enhanced layer signal and transmitted through a second transmitting antenna, wherein the second transmission signal is generated without combining the second enhanced layer signal with the core layer signal.

2. The broadcast signal transmission apparatus of claim 1, wherein, when the first enhanced layer signal is a horizontal polarization signal, the first transmitting antenna corresponds to a horizontal polarization antenna, whereas when the first enhanced layer signal is a vertical polarization signal, the first transmitting antenna corresponds to a vertical polarization antenna.

3. The broadcast signal transmission apparatus of claim 2, wherein transmission power of data included in the second transmission signal is lower than transmission power of data included in the first transmission signal by a preset transmission power offset.

4. The broadcast signal transmission apparatus of claim 3, wherein the first transmission signal includes a first bootstrap, a first preamble, and first data, and transmission powers of the first bootstrap, the first preamble, and the first data are identical to each other.

5. The broadcast signal transmission apparatus of claim 4, wherein, when a second bootstrap and a second preamble are included in the second transmission signal, transmission powers of the second bootstrap and the second preamble are lower than transmission power of the first transmission signal by the preset transmission power offset.

6. The broadcast signal transmission apparatus of claim 4, wherein, when a second bootstrap and a second preamble are not included in the second transmission signal, the second transmission signal is transmitted to include a sequence having transmission power identical to that of second data included in the second transmission signal.

7. The broadcast signal transmission apparatus of claim 6, wherein the sequence is transmitted at a time point at which the first bootstrap and the first preamble are transmitted, and corresponds to a binary sequence.

8. The broadcast signal transmission apparatus of claim 3, further comprising:
injection level controllers for controlling transmission powers of the enhanced layer signals.

9. The broadcast signal transmission apparatus of claim 1, further comprising:
a Bit-Interleaved Coded Modulation (BICM) unit for performing channel coding, bit interleaving, and constellation mapping on the core layer data.

10. The broadcast signal transmission apparatus of claim 1, wherein the enhanced layer signals are generated by performing channel coding, bit interleaving, Multiple-Input Multiple-Output (MIMO) demultiplexing, and constellation mapping on the enhanced layer data.

11. A broadcast signal reception apparatus, comprising:
signal receivers for generating received signals based on signals received through multiple receiving antennas;
a first decoder for reconstructing a core layer signal corresponding to a signal received through a first receiving antenna; and
a second decoder for reconstructing an enhanced layer signal based on a first enhanced layer signal produced by removing the core layer signal from the signal received through the first receiving antenna, and a second enhanced layer signal produced from a signal received through the second receiving antenna, wherein the core layer signal is not present in the signal received through the second receiving antenna and the second enhanced layer signal is produced without removing the core layer signal from the signal received through the second receiving antenna.

12. The broadcast signal reception apparatus of claim 11, wherein the first receiving antenna and the second receiving antenna receive signals having different polarizations, wherein the first receiving antenna corresponds to a horizontal polarization antenna or a vertical polarization antenna.

13. The broadcast signal reception apparatus of claim 12, wherein the core layer signal is reconstructed by performing channel decoding, bit deinterleaving, and constellation demapping on the signal received through the first receiving antenna.

14. The broadcast signal reception apparatus of claim 13, wherein a cancellation signal is generated by performing channel coding, bit interleaving, and constellation mapping on the reconstructed core layer signal, and the first enhanced layer signal is extracted by removing the cancellation signal from the signal received through the first receiving antenna.

15. The broadcast signal reception apparatus of claim 13, wherein the enhanced layer signal is reconstructed by performing channel decoding, bit deinterleaving, MIMO multiplexing, and constellation demapping on the first enhanced layer signal and the second enhanced layer signal.

16. The broadcast signal reception apparatus of claim 13, wherein the received signals are generated by performing an OFDM signal demodulation process on the signals received through the multiple receiving antennas.

17. A broadcast signal transmission apparatus, comprising:
a Multiple-Input Multiple-Output (MIMO) Bit-Interleaved Coded Modulation (BICM) unit for dividing enhanced layer data into two enhanced layer signals having different polarizations;
a first combination unit for generating a first multiplexed signal corresponding to a first transmitting antenna by combining a core layer signal corresponding to core layer data with a first enhanced layer signal;
a second combination unit for generating a second multiplexed signal corresponding to a second transmitting antenna by combining the core layer signal with the second enhanced layer signal; and
transmission signal generation units for generating a first transmission signal, corresponding to the first multiplexed signal and transmitted through the first transmitting antenna, and a second transmission signal, corresponding to the second multiplexed signal and transmitted through the second transmitting antenna,
wherein, when the first enhanced layer signal is a horizontal polarization signal, the first transmitting antenna corresponds to a horizontal polarization antenna, whereas when the first enhanced layer signal is a vertical polarization signal, the first transmitting antenna corresponds to a vertical polarization antenna, and
wherein transmission power of data included in the first transmission signal is identical to transmission power of data included in the second transmission signal.

18. The broadcast signal transmission apparatus of claim 17, wherein:
the first transmission signal includes a first bootstrap, a first preamble, and first data, and transmission powers of the first bootstrap, the first preamble, and the first data are identical to each other, and the second transmission signal includes a second bootstrap, a second preamble and second data, and transmission powers of the second bootstrap, the second preamble, and the second data are identical to each other.

* * * * *